United States Patent [19]
Peterson et al.

[11] Patent Number: 5,298,735
[45] Date of Patent: Mar. 29, 1994

[54] LASER DIODE AND PHOTODETECTOR CIRCUIT ASSEMBLY

[75] Inventors: David L. Peterson, Pittsford; James G. Phalen; John P. Shepherd, both of Rochester; Gilbert A. Hawkins, Mendon, all of N.Y.

[73] Assignee: Eastman Kodak Company, Rochester, N.Y.

[21] Appl. No.: 957,115

[22] Filed: Oct. 7, 1992

[51] Int. Cl.[5] ............................................. H01J 40/14
[52] U.S. Cl. ................................... 250/214.1; 257/82
[58] Field of Search .................. 250/214.1, 551, 216, 250/552; 257/80, 81, 82

[56] References Cited

U.S. PATENT DOCUMENTS

| | | | |
|---|---|---|---|
| 3,631,251 | 12/1971 | Lehovec | 257/82 |
| 4,419,011 | 12/1983 | Matsuda et al. | 250/552 |
| 4,511,248 | 4/1985 | Abbas | 356/4 |
| 4,906,839 | 3/1990 | Lee | 257/82 |
| 4,983,009 | 1/1991 | Musk | 257/82 |

Primary Examiner—David C. Nelms
Attorney, Agent, or Firm—Raymond L. Owens

[57] ABSTRACT

A laser diode having an output facet and a back facet is placed in contact with a designated edge of a die and oriented such that said output facet is substantially parallel to said top surface of said die. At least one photodetector is fabricated on the dye top surface.

8 Claims, 3 Drawing Sheets

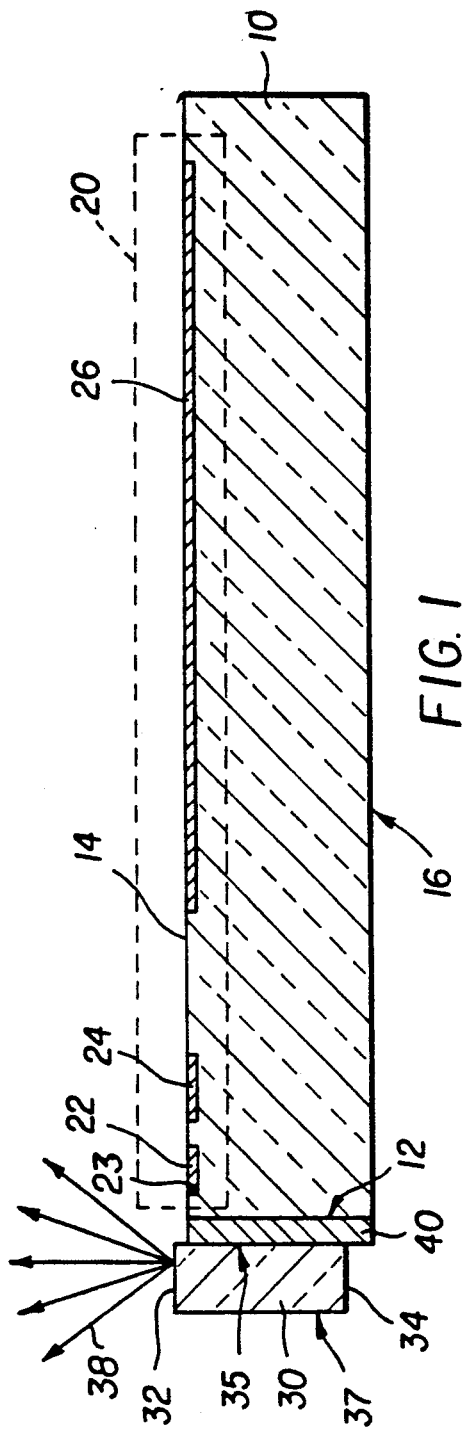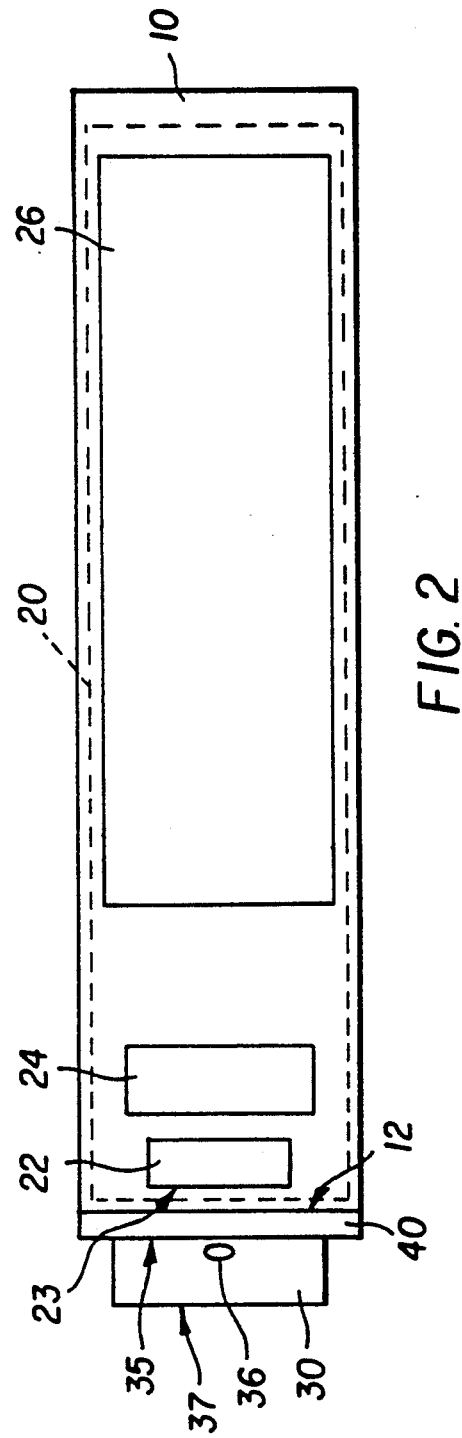

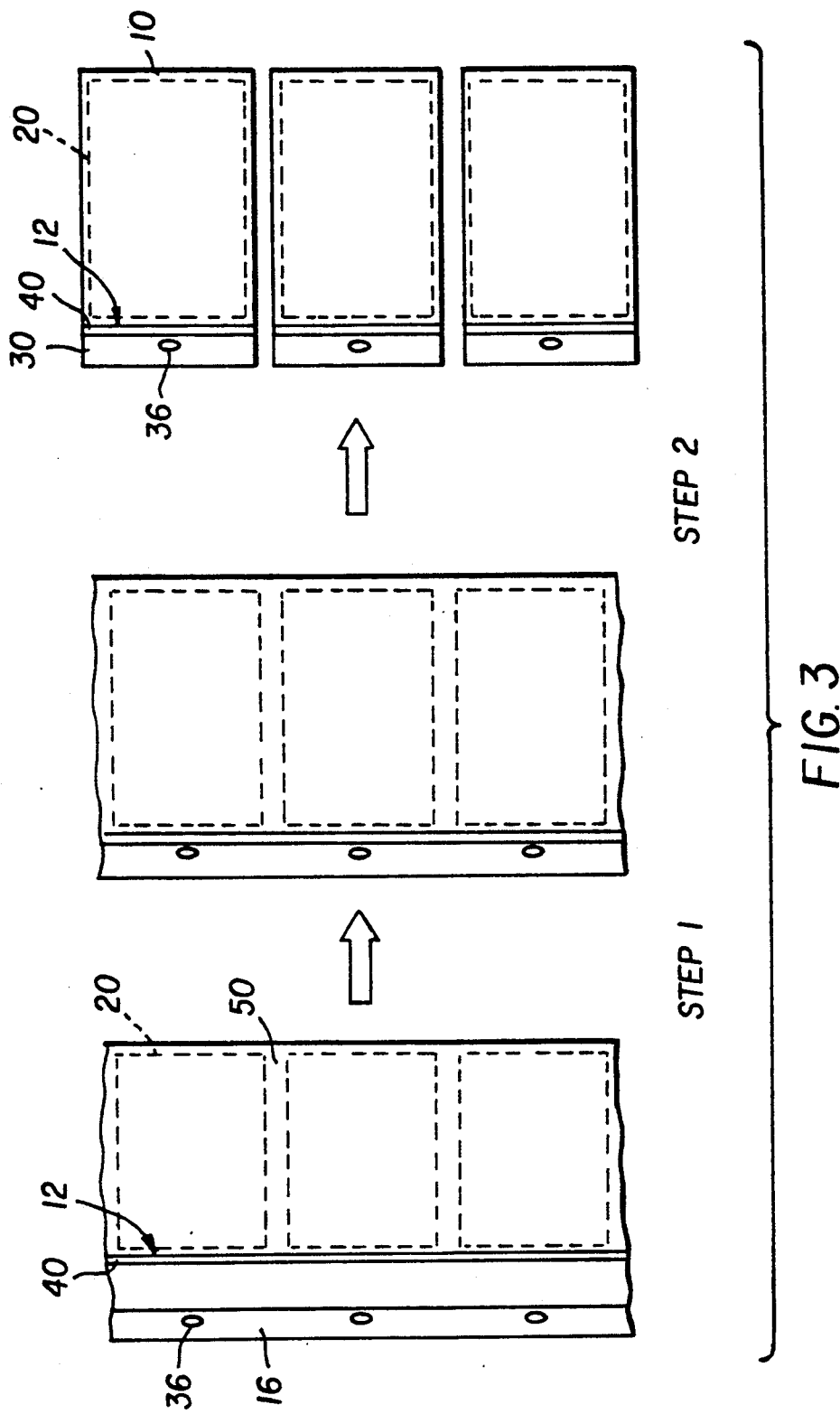

LASER DIODE AND PHOTODETECTOR CIRCUIT ASSEMBLY

FIELD OF THE INVENTION

The present invention relates to articles having a laser diode and photodetector circuitry. In particular, it concerns assemblies in which one or more photodetectors are placed relative to a light emitter.

BACKGROUND OF THE INVENTION

Spatial arrangements of light emitters, photodetectors and signal processing electronics are vital components of many optical communications, data storage and measurement systems. In order to improve device performance and reduce manufacturing costs, there has been considerable effort aimed towards opto-electronic device integration. There is a well established art concerning the integration of photodetectors with electronic circuitry. For example, systems, such as cameras, based on the charge-coupled-device (CCD) are common. In the prior art, there are also examples of the integration of laser diodes with power monitoring photodiodes. The practical integration of light emitters with either or both sensitive photodetectors and electronics has not been realized. The preferred embodiment of light emitters involves heavily doped compound semiconductor, such as GaAs and InP, substrates, while that of photodetectors and electronics involves lightly doped silicon substrates. This presents a substantial obstacle when a closely spaced arrangement of high performance light emitters and sensitive photodetectors is needed.

The following patent is representative of the need in the prior art for the practical implementation of devices based on the spatial arrangement of light emitters and photodetectors: "Active Electro-Optical Distance Detection Methods and Devices", by Daniel C. Abbas (U.S. Pat. No. 4,511,248, April 1985), describes an optical distance measuring device. Light from an emitter, located in the focal plane, is directed through a lens unto the target object. A portion of the light is reflected off the object and back through the lens forming a blur circle. The measurement technique is based on determining the size of the blur circle, by measuring the slope of its amplitude, using a pair of photodetectors and, hence, the distance to the object. This device has been constructed using a light-emitting-diode (LED) and a pair of photodiodes monolithically integrated on a substrate. It is not practical, at this point in time, to integrate the emitter, detector and electronic functions monolithically. As the dimensions, e.g., the separation of the LED from the detectors, are reduced to satisfy application requirements, the optical isolation of the light emitter from the photodetectors becomes an increasingly severe problem with the light from the emitter swamping the weak reflected signals.

SUMMARY OF THE INVENTION

It is an object of this invention to provide the integration of a light emitter with one or more photodetectors and which has effective optical isolation.

This object is achieved in a laser diode and electronic circuit assembly comprising:

(a) a semiconductor die, having a top surface, a bottom surface, and a designated edge;

(b) an electronic circuit including a photodetector fabricated on the top surface of the die; and (c) a laser diode, having an output facet and a back facet, placed in contact with the designated edge of the die and oriented such that the output facet is substantially parallel to the top surface of the die.

An advantage of this invention is that it provides a high degree of optical isolation between an intense light source and adjacent sensitive photodetectors. Further, it makes use of superior photodetectors and electronics found in silicon technology and the efficient emitters in compound semiconductor technology. A laser diode circuit detector assembly made in accordance with this invention can provide well defined spatial relationships between laser diodes and photodetectors that maintains desired optical isolation.

BRIEF DESCRIPTION OF THE DRAWINGS

FIG. 1 is a schematic cross sectional view of a laser diode and photodetector circuit assembly;

FIG. 2 is a schematic top view of the assembly of FIG. 1;

FIG. 3 is a schematic view showing a step in attaching a multitude of laser diodes to photodetector circuit die to form device assemblies.

DETAILED DESCRIPTION OF THE INVENTION

Figure 4:
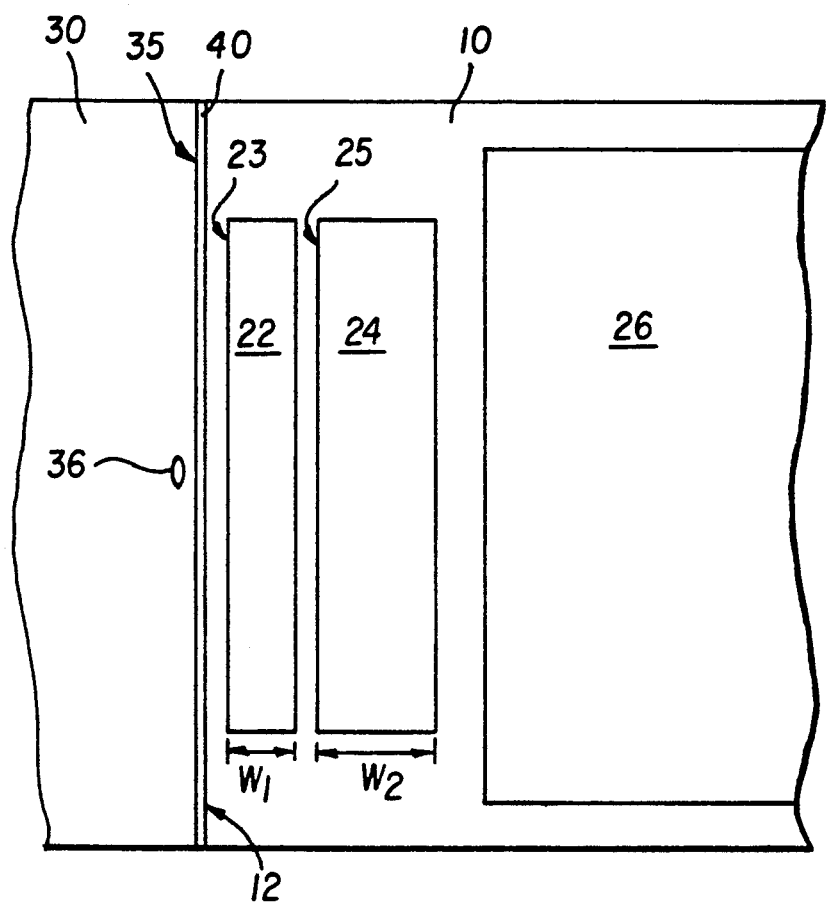
FIG. 4 is a schematic view of a particular laser diode and photodetector circuit assembly used in a blur circle rangefinding system.

A cross sectional view of a laser diode (LD) and photodetector (PD) circuit assembly is shown in FIG. 1. A photodetector circuit 20, includes of one or more photodetectors, 22 and 24, and a circuit of electronic components 26, is fabricated on the top surface 14 of a semiconductor die 10. Preferably, the composition of the semiconductor die is silicon. The photodetectors and electronic circuit can be manufactured using processes well known in the art. Possible electronic components include transistors, capacitors, resistors, conductive traces and bondpads. The semiconductor die also has a bottom surface 16 and an edge 12 that has been prepared for the attachment of a laser diode 30. The laser diode has a back facet 34 and output facet 32 from which light, represented by the arrows 38, is emitted. An important feature of this construction is that the output facet is substantially parallel to the top surface 14 of the photodetector circuit die. This orients the direction of the laser beam 38 with respect to the photodetector circuit 20. The particular structure and device properties, such as emission wavelength, of the laser diode would be selected based on the needs of the application. The preparation of the designated edge 12 of the semiconductor die may also include the deposition of thin intermediate layers 40. A preferred embodiment of the intermediate layers consists of a solder layer, such as InSn or AuSn eutectic, and barrier layers, such as PtSi and TiN, to ensure proper electrical and thermal conductivity as well as good adhesion to the semiconductor die. These opaque metallic materials for the intermediate layers 40 provide an efficient way to optically isolate the laser diode from the photodetector circuit. In this preferred embodiment, the laser diode is soldered to the silicon die which provides one of the electrical contacts to the laser diode and serves as a thermal sink for the heat generated within the laser diode.

A top view of the laser diode and photodetector circuit assembly of FIG. 1 is shown in FIG. 2. The number, size and location of the photodetectors in the photodetector circuit 20 is determined by the device application. In this example, there are two photodetectors, 22 and 24, with a given size and location on the die 10. The designated edge 12 may be fabricated in close proximity (less than 100 μm) to the photodetectors 22 and 24. Using lapping and polishing techniques common to the art, the separation of this edge 12 from the closest photodetector edge 23 could be 5 μm or less. The intermediate layers 40 may have a total thickness of 2 μm. The emission zone 36 of the laser diode 30 is located within 2 μm of the closest laser diode surface 35. This results in the emission zone 36 being in close proximity to the designated die edge 12. By close proximity, we mean less than 100 μm. Electrical contact to the laser diode is accomplished through the metallized surfaces 35 and 37. With fabrication techniques and components common to the art, it is possible to obtain an emitter-photodetector separation of 10 μm.

A method for constructing the laser diode and photodetector circuit assembly is illustrated in FIG. 3. The semiconductor die is composed of silicon and, as currently practiced in the art, the photodetector circuits 20 are fabricated in a rectangular pattern on round semiconductor wafers. This rectangular pattern exhibits a characteristic pitch or center-to-center spacing among the photodetector circuits. The round wafers are cut parallel to the designated edge 12 to form photodetector circuit bars 50. The designated edge 12 is then fabricated and the intermediate layers 40 are deposited on its exposed surface. As practiced in the art, the laser diodes are fabricated on compound semiconductor substrates such as GaAs. The output and back facets of the laser diodes are formed by cleaving the substrate into laser diode bars 60. The laser diode bar 60 is constructed such that the emission zones 36 have a characteristic pitch or center-to-center spacing equal to that of the photodetector circuit die. The laser diode bar is then attached to the photodetector circuit bar. Since these bars are significantly larger than the individual die and diodes, the precision alignment is accomplished more easily. During this alignment the output facet of the laser diodes is positioned relative to the top surface of the die. Depending on the application, this position could be coplanar or intentionally displaced from coplanar. Preferably, the output facet and the top surface 14 are not coplanar, with the output facet being spaced above the top surface of the photodetector circuit, to provide better optical isolation. To aid non-coplanar alignment, the back facet and bottom die surface can be placed against a reference surface to ensure their coplanarity, the position of the front facet relative to the top die surface is achieved by cleaving the laser diode to a proper cavity length relative to the die thickness. Once the laser diode bar has been attached to the photodetector circuit bar, that construction is singulated using techniques familiar to the art into individual laser diode and photodetector circuit assemblies.

This invention can be used in the blur circle distance measuring system described by Abbas (U.S. Pat. No. 4,511,248, April, 1985) in which the laser diode and photodetector circuit assembly provide the emission and detection means and, preferably, signal processing means as illustrated in FIG. 4. The emission means is accomplished with the laser diode, while detection is accomplished with two photodetectors within the photodetector circuit. A practical use of this system is in a camera that measures distances up to 2.0 m using a lens of 12 mm diameter and 12 mm focal length. This would be accomplished with a pair of photodetectors 22 and 24 with widths $w_1 = 15$ μm and $w_2 = 25$ μm, respectively. The lengths of these photodetectors are selected so as to maximize signal collection from the blur circle and assembly tolerances parallel to the designated edge 12 while attempting to minimize the amount of background signal due to dark current and ambient light. The photodetectors are positioned such that the edges 23 and 25 are 10 μm and 30 μm from the emission zone, respectively. In this arrangement, the electronic circuitry would include all or part of the necessary signal processing functions for this application, such as timing, signal amplification, subtraction, and division.

The invention has been described in detail with particular reference to certain preferred embodiments thereof, but it will be understood that variations and modifications can be effected within the spirit and scope of the invention.

What is claimed is:

1. A laser diode and electronic circuit assembly comprising:
   (a) a semiconductor die, having a top surface, a bottom surface, and a designated edge;
   (b) an electronic circuit including a photodetector fabricated on said top surface of said die; and
   (c) a laser diode, having an output facet and a back facet, placed in contact with said designated edge of said die and oriented such that said output facet is substantially parallel to said top surface of said die.

2. A laser diode and photodetector circuit assembly comprising:
   (a) a semiconductor die, having a top surface, a bottom surface, and a designated edge;
   (b) a photodetector circuit, consisting of one or more photodetectors and electronic components, fabricated on said top surface of said die; and
   (c) a laser diode, having an output facet and a back facet, placed in contact with said designated edge of said die and oriented such that said output facet is substantially parallel to said top surface of said die.

3. A laser diode and photodetector circuit assembly comprising:
   (a) a semiconductor die, having a top surface, a bottom surface, and a designated edge;
   (b) a photodetector circuit, consisting of one or more photodetectors and electronic components, fabricated on said top surface of said die;
   (c) a laser diode, having an output facet and a back facet, attached to said designated edge of said die and oriented such that said output facet is substantially parallel to said top surface of said die; and
   (d) one or more layers of intermediate material placed between said laser diode and said designated edge that provide desired adhesion, electrical conductive, and thermal conductive properties.

4. The laser diode and photodetector circuit assembly of claim 3 wherein at least one of the layers includes a metallic opaque material which provides for optical isolation between the detectors and the laser diode.

5. The laser diode and photodetector circuit assembly of claim 3 in which the said laser diode is oriented such that its output beam is proximate to said die edge.

6. The laser diode and photodetector circuit assembly of claim 3 wherein the output facet of the laser diode is disposed in a plane spaced from the photodetector circuit.

7. The laser diode and photodetector circuit assembly of claim 3 in which the designated edge of said die is proximate to one or more of said photodetectors.

8. The laser diode and photodetector circuit assembly of claim 3 in which said back facet of said laser diode is substantially coplanar with said bottom surface of said die.

* * * * *